United States Patent [19]
Hatanaka et al.

[11] Patent Number: 5,394,388
[45] Date of Patent: Feb. 28, 1995

[54] MULTIPLE MICROPROBE ARRAYS FOR RECORDING AND REPRODUCING ENCODED INFORMATION

[75] Inventors: Katsunori Hatanaka, Yokohama; Kunihiro Sakai, Isehara; Takahiro Oguchi, Ebina; Akihiko Yamano, Sagamihara; Shunichi Shido, Yokohama, all of Japan

[73] Assignee: Canon Kabushiki Kaisha, Tokyo, Japan

[21] Appl. No.: 243,524

[22] Filed: May 16, 1994

Related U.S. Application Data

[63] Continuation of Ser. No. 889,404, May 28, 1992, abandoned.

[30] Foreign Application Priority Data

Jun. 5, 1991 [JP] Japan ................................. 3-134211

[51] Int. Cl.$^6$ ............................................. G11B 9/00
[52] U.S. Cl. .................................... 369/126; 369/101; 250/306
[58] Field of Search ................. 250/306, 307, 442.11, 250/309; 369/126, 276, 288, 101, 124

[56] References Cited

U.S. PATENT DOCUMENTS

| | | | |
|---|---|---|---|
| 5,032,713 | 7/1991 | Eguchi et al. | 250/211 R |
| 5,075,548 | 12/1991 | Kajimura | 250/306 |
| 5,144,581 | 9/1992 | Toda et al. | 369/126 |
| 5,150,035 | 9/1992 | Nose et al. | 250/306 |
| 5,202,879 | 4/1993 | Oguchi et al. | 369/126 |
| 5,204,851 | 4/1993 | Kawada et al. | 369/126 |
| 5,329,515 | 7/1994 | Kawagishi et al. | 369/126 |

FOREIGN PATENT DOCUMENTS

| | | |
|---|---|---|
| 61-80536 | 4/1986 | Japan . |
| 62-281138 | 12/1987 | Japan . |
| 63-161552 | 7/1988 | Japan . |
| 63-161553 | 7/1988 | Japan . |
| 01196751 | 8/1989 | Japan . |

OTHER PUBLICATIONS

Physical Review Letters, vol. 49, No. 1, Jul. 5, 1982, published by The American Physical Society.

*Primary Examiner*—Paul M. Dzierzynski
*Assistant Examiner*—Kim-Kwok Chu
*Attorney, Agent, or Firm*—Fitzpatrick, Cella Harper & Scinto

[57] ABSTRACT

Information recording/reproducing apparatus and method by use of probe electrodes are disclosed. In this method, information to be recorded on a recording medium is encoded. The encoded information is distributed to a plurality of probe electrodes. The plurality of probe electrodes are driven on the basis of the distributed information so as to record the information on the recording medium. In reproduction, the information recorded on the recording medium is read out from the recording medium by use of the plurality of probe electrodes. The information read out from the recording medium is stored by use of the plurality of probe electrodes. The stored information is decoded to reproduce the information recorded on the recording medium. The encoding is performed by changing the information to be recorded to information added with an error correction code.

14 Claims, 7 Drawing Sheets

FIG. 7

| LOCATION CODE | DISTRIBUTING DEVICE OUTPUT | | | | | | |
|---|---|---|---|---|---|---|---|
| | $d_{m-1}$ | $d_{m-2} \cdots d_n$ | $d_{n-1} \cdots d_2$ | | $d_1$ | $d_0$ |
| 0 | 0 | $0 \cdots 0$ | $c_{n-1} \cdots c_2$ | | $c_1$ | $c_0$ |
| 1 | 0 | $0 \cdots c_{n-1}$ | $c_{n-2} \cdots c_1$ | | $c_0$ | 0 |
| 2 | 0 | $0 \cdots c_{n-2}$ | $c_{n-3} \cdots c_0$ | | 0 | 0 |
| . | . | . . | . . | | . | . |
| . | . | . . | . . | | . | . |
| . | . | . . | . . | | . | . |
| L−1 | $c_{n-1}$ | $c_{n-2} \cdots c_x$ | $c_{x-1} \cdots 0$ | | 0 | 0 |

($[c_{n-1}, c_{n-2}, \cdots c_2, c_1, c_0]$ IS INPUT ENCODING WORD)

MULTIPLE MICROPROBE ARRAYS FOR RECORDING AND REPRODUCING ENCODED INFORMATION

This application is a continuation of application Ser. No. 07/889,404, filed May 28, 1992, which is now abandoned.

BACKGROUND OF THE INVENTION

1. Field of the Invention

The present invention relates to a technique for recording/reproducing information on/from a recording medium using a plurality of probes, for example, to a high-density data recording/reproduction technique adopting the STM principle.

2. Related Background Art

As conventional memories, semiconductor memories and magnetic memories using magnetic materials and semiconductors materials are popular. In recent years, along with development of the laser technique, inexpensive, high-density recording media comprising optical memories using organic thin films such as organic dyes, photopolymers, and the like are available.

Recently, a scanning tunnel microscope (to be abbreviated as an STM hereinafter), which can directly observe an electron structure of atoms on the surface of a conductor, has been developed [B. Binning et al. Phys. Rev. Lett. 49.57 (1982)]. The STM allows a high-resolution measurement of a real space image regardless of mono-crystalline or amorphous structures. In addition, the STM allows to observe a sample with a low electrical power without damaging the sample by a current. Furthermore, since the STM can operate in air, and can be used for various materials, a wide application range is expected. The STM utilizes a phenomenon that when a voltage is applied between a metal probe (probe electrode) and a conductive substance, and the probe electrode is brought close to the conductive substance, i.e., a position at a distance of about 1 nm therefrom, a tunnel current flows. This current is very sensitive to a change in distance between the probe electrode and the sample. When the probe electrode is scanned to maintain a constant tunnel current, various kinds of information associated with all the electron clouds in a real space can be read. In this case, the resolution in the planar direction (in-surface direction) is about 0.1 nm.

Therefore, high-density recording/reproduction on the atomic order (sub nanometer order) can be satisfactorily performed by applying the STM principle. For example, in a recording/reproduction apparatus disclosed in Japanese Patent Application Laid-Open No. 61-80536, data is written by removing atomic particles attached to the surface of a medium by, e.g., an electron beam, and the written data is reproduced by the STM.

Japanese Patent Application Laid-Open Nos. 63-161552, 63-161553, and the like disclose a method of recording/reproducing information by the STM using, as a recording layer, a thin film layer of a material such as a K electron-based organic compound or a chalcogen compound having a memory effect with respect to voltage-current switching characteristics. With this method, if the recording bit size is assumed to be 10 nm, large-capacity recording/reproduction of $10^{12}$ bits/cm$^2$ can be realized.

For the purpose of attaining a further compact structure, Japanese Patent Application Laid-Open Nos. 62-281138, 1-196751, and the like propose an apparatus wherein a plurality of probe electrodes are formed on a semiconductor substrate, and recording is performed by rotating a recording medium opposing the semiconductor substrate. For example, when a multi-probe head having 2,500 probe electrodes arranged on a 1-cm$^2$ silicon chip is combined with a material having a memory effect, large-capacity digital data recording/reproduction having a recording capacity of 400 Mbits per probe and a total recording capacity of 1 Tbit can be realized.

When a recording/reproduction apparatus using a multi-probe head is constituted in practice, the following points must be taken into consideration.

(1) It is difficult to manufacture 2,500 probe electrodes constituting the multi-probe head without defects. Therefore, in order to increase the manufacturing yield, defective probe electrodes must be permitted to some extent.

(2) The probe electrodes may suffer from some damage after they are repetitively used. When one probe electrode is damaged, 400-Mbit data is lost. In order to assure reliability, recording data must be restored even when the probe electrodes are damaged.

(3) A recording medium is required to have evenness on the molecular order. Even when a recording layer having high orientation characteristics is formed by utilizing, e.g., the Langmuir-Blodgett technique, it is very difficult to completely remove pinholes on the molecular order. Therefore, a countermeasure against data omission caused by a partial defect of a recording medium must be taken.

In conventional semiconductor memories, in order to improve reliability, a redundancy bit is prepared in advance, and when a defective bit is generated, the defective bit is replaced with the redundancy bit, thus compensating for the defective bit generated in a semiconductor manufacturing process. On the other hand, magnetic disks, optical disks, and the like employ an error correction method to compensate for a partial defect of a medium. In a recording mode using the error correction method, a k-bit input signal is converted into an n-bit code, and the n-bit code is recorded on a medium. In a reproduction mode, an n-bit signal is read from the medium, is decoded to a k-bit signal, and the k-bit signal is output. In this case, $k<n$, and even when some bits of the n-bit encoding word recorded on the medium change due to an error, an original correct signal can be decoded in a decoding mode. A large number of encoding methods such as BCH encoding, Fire encoding, Reed-Solomon encoding, and the like have been proposed according to applications. The error correction based on encoding can mainly remove a random error. On the other hand, a burst error caused by scratches on a recording medium, peeling of a recording layer, or the like is coped with by combining an encoding as described above and an interleave method. In this case, an encoding word string must be double-coded using product codes or continuous codes over a data area sufficiently larger than an expected maximum burst error length.

Note that in the interleave method, a burst error is distributed to some encoding words to be converted to short burst errors or random errors, thereby performing error detection and correction. For example, a k-bit input signal is encoded to n bits (such encoding will be referred to as (n,k) encoding hereinafter). L n-bit encoding words are collected, and are arranged on an L (columns)×n (rows) matrix, as shown in FIG. 1. The encoding words are sequentially output from the first row to obtain new L-bit encoding words. The L-bit encoding words are recorded. Thus, a burst error of L bits or less can be distributed to L recorded signal words bit by bit. In other words, a burst error is converted into random errors.

However, in a memory device for performing recording/reproduction on the molecular order using 2,500 multi-probe electrodes, the following subjects must be attained to assure reliability against damage to the probes, partial defects of a medium, and the like using the above-mentioned conventional error correction method.

(1) In order to provide redundancy for a probe defect, it is possible to arrange redundant probe electrodes. However, since the number of probe electrodes is as large as 2,500, a mechanism for detecting defective probe electrodes, storing the positions of the defective probe electrodes, and replacing the defective probe electrodes with redundant probe electrodes is complicated.

(2) Damage to the probe electrodes and partial defects of a recording medium result in burst errors, and the above-mentioned error correction method can be applied in principle. However, damage of one probe electrode corresponds to a 400-Mbit burst error, and a 100-$\mu m^2$ medium defect corresponds to a 100-Mbit burst error. In order to perform error correction corresponding to such a large burst error length, a large encoding calculation amount, and a large work memory space are required. This is because a series of code lengths must be set to be considerably longer than a burst error length even when double-encoding is performed. For this reason, the apparatus becomes large in size, and large-capacity ($10^{12}$ bits/cm$^2$), compact, and high-density characteristics cannot be utilized.

SUMMARY OF THE INVENTION

The present invention has been made to attain the above-mentioned two subjects, and has as its object to provide a multi-probe type memory apparatus using, e.g., the STM principle, which can eliminate the influence of defects upon manufacture of probe electrodes, and can prevent data omission caused by damage of probe electrodes, a partial defect of a recording medium, and the like.

In order to achieve the above object, an information recording apparatus for recording information on a recording medium using probe electrodes, includes a recording medium, a plurality of probe electrodes opposing the recording medium, and means for encoding information to be recorded, distributing the encoded information to the plurality of probe electrodes, and driving the plurality of probe electrodes on the basis of the distributed information so as to record the information on the recording medium.

Furthermore, in order to achieve the above object, an information recording/reproduction apparatus for recording and reproducing information on and from a recording medium using probe electrodes, includes a recording medium, a plurality of probe electrodes opposing the recording medium, means for encoding information to be recorded, distributing the encoded information to the plurality of probe electrodes, and driving the plurality of probe electrodes on the basis of the distributed information so as to record the information on the recording medium, means for reading out information from the recording medium using the plurality of probe electrodes, and means for storing the information read out from the recording medium using the plurality of probe electrodes, and decoding the stored information to reproduce the recorded information.

Moreover, in order to achieve the above object, an information recording method for recording information on a recording medium using a plurality of probe electrodes, includes the step of encoding information to be recorded, distributing the encoded information to the plurality of probe electrodes, and driving the plurality of probe electrodes on the basis of the distributed information so as to record the information on the recording medium.

In addition, in order to achieve the above object, an information recording/reproduction method for recording and reproducing information on and from a recording medium using a plurality of probe electrodes, includes the step of encoding information to be recorded, distributing the encoded information to the plurality of probe electrodes, and driving the plurality of probe electrodes on the basis of the distributed information so as to record the information on the recording medium, the step of reading out information from the recording medium using the plurality of probe electrodes, and the step of storing the information read out from the recording medium using the plurality of probe electrodes, and decoding the stored information to reproduce the recorded information.

BRIEF DESCRIPTION OF THE DRAWINGS

FIG. 7 is a table showing an example of a data arrange table ROM.

DETAILED DESCRIPTION OF THE PREFERRED EMBODIMENTS

Figure 1:
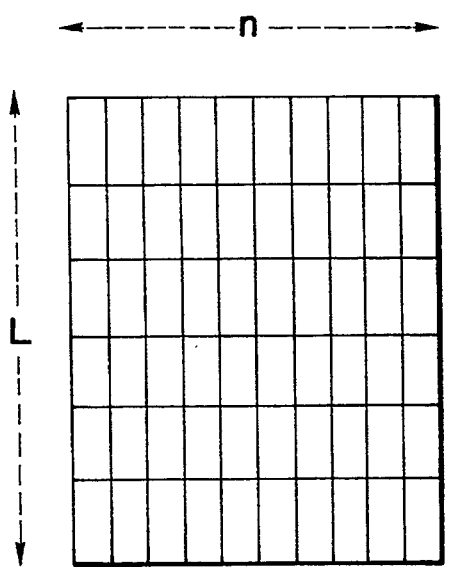
FIG. 1 is an explanatory view of an interleave method.
Figure 2:
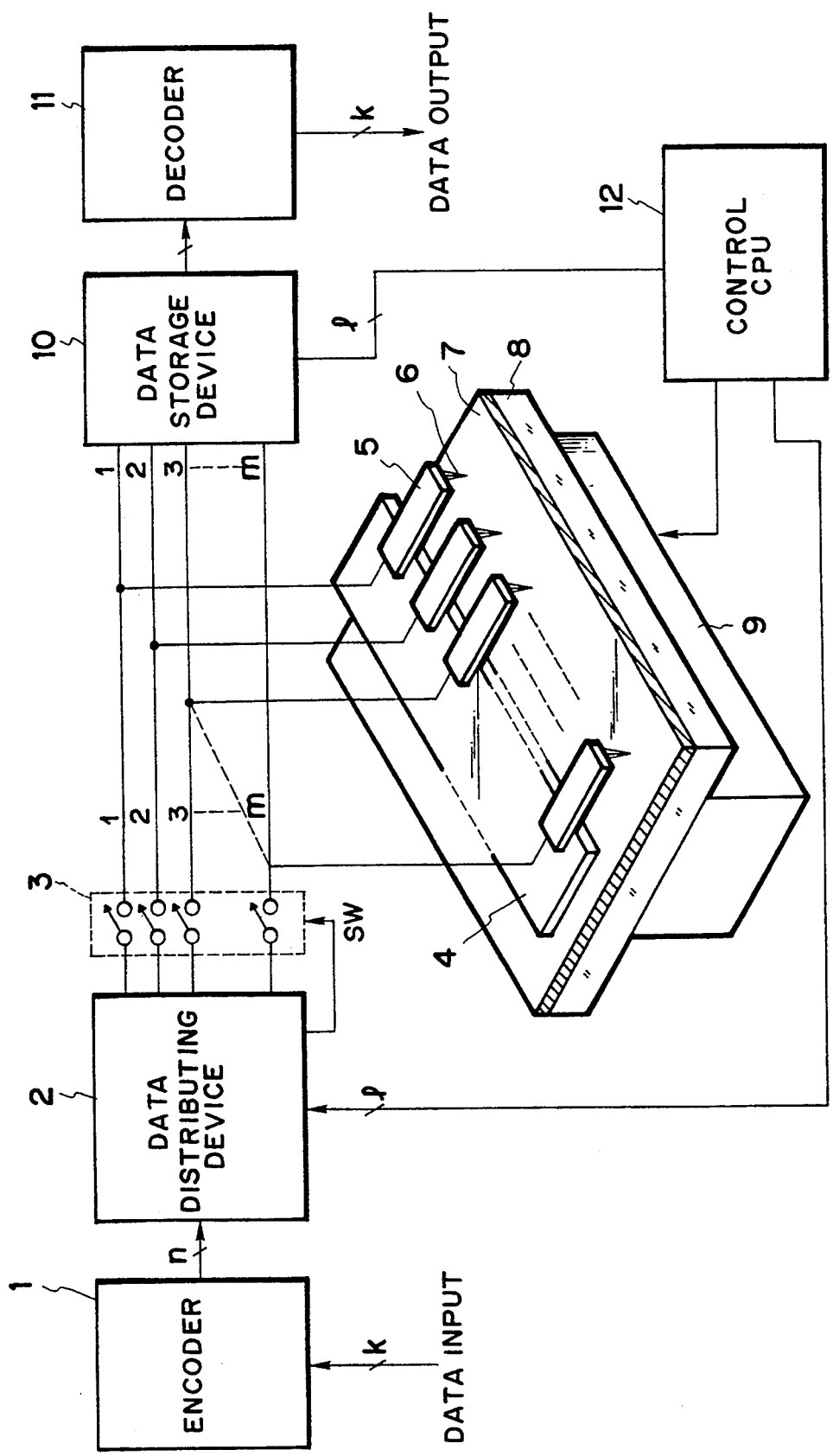
FIG. 2 is a diagram showing an embodiment of an information recording/reproduction apparatus according to the present invention.

An embodiment of the present invention applied to an information recording/reproduction apparatus will be described in detail below with reference to the accompanying drawings. FIG. 2 shows the overall arrangement of the apparatus of this embodiment. In FIG. 2, the apparatus includes an encoder 1, a data distributing device 2, a switch 3 connected when a write signal is supplied to probe electrodes, and a multi-probe head 4, which holds a plurality of parallel cantilevers 5, and has probe electrodes 6 supported at the distal end portions of the cantilevers 5. The apparatus of this embodiment has m (=2,500) cantilevers 5 and probe electrodes 6 arranged on a single substrate. These cantilevers and probe electrodes are manufactured by the micromachining technique based on micromechanics. Each cantilever 5 is flexed by a control signal to be able to adjust the interval (Z direction) between the probe electrode 6 and a recording medium 7 having a substrate 8. The apparatus also includes a stage 9 for moving the recording medium 7 in the X-Y direction, and controlling the position of the recording medium accessed by the probe electrodes, a data storage device 10, a decoder 11, and a control CPU 12. The control CPU 12 drives the stage 9 to move the multi-probe head 4 to trace a specific track of the recording medium. The control CPU 12 also performs a series of write/read control operations.

Figure 3:
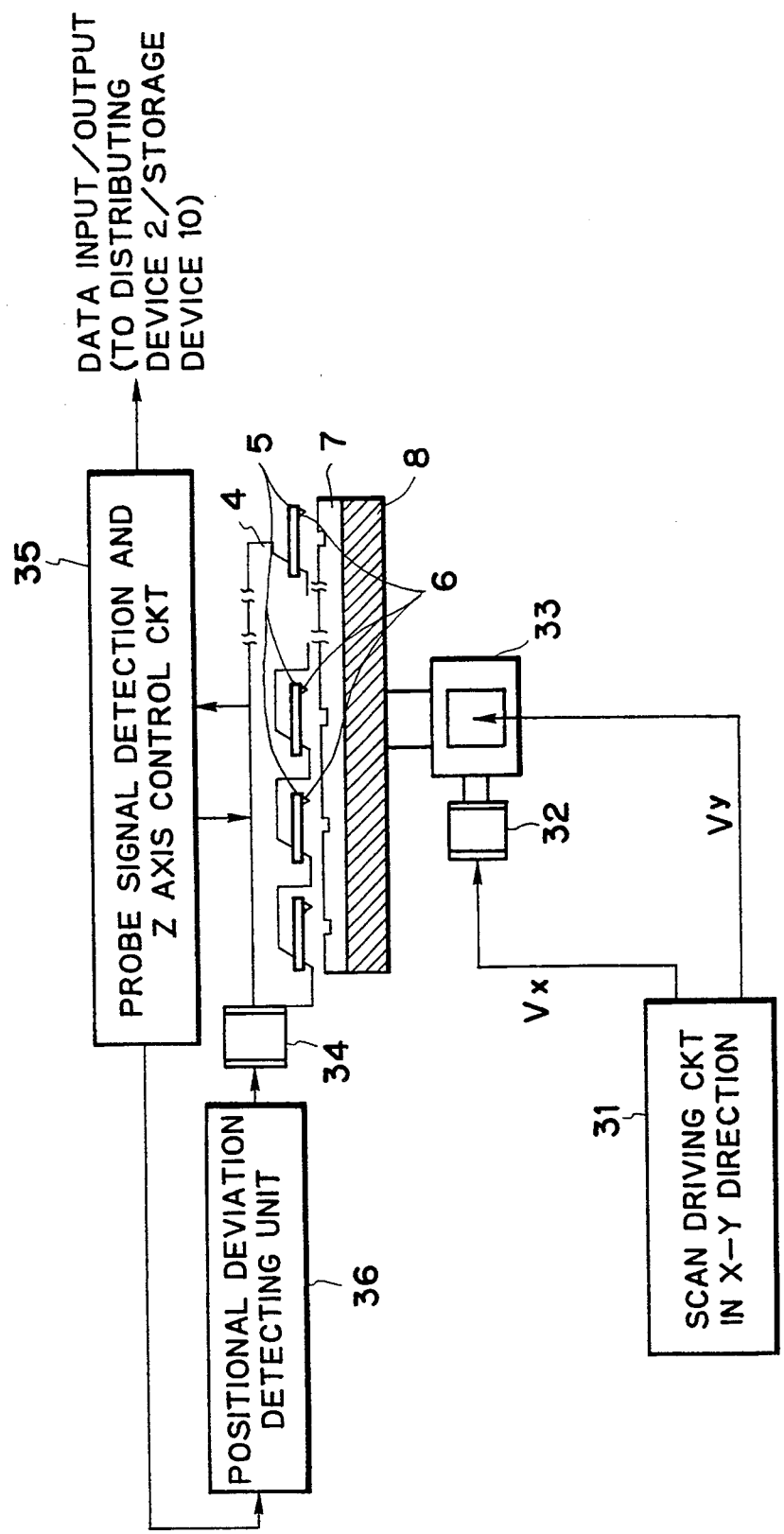
FIG. 3 is a diagram showing details of a mechanism for controlling the positional relationship between probe electrodes and a recording medium in the apparatus shown in FIG. 2.
Figure 4:
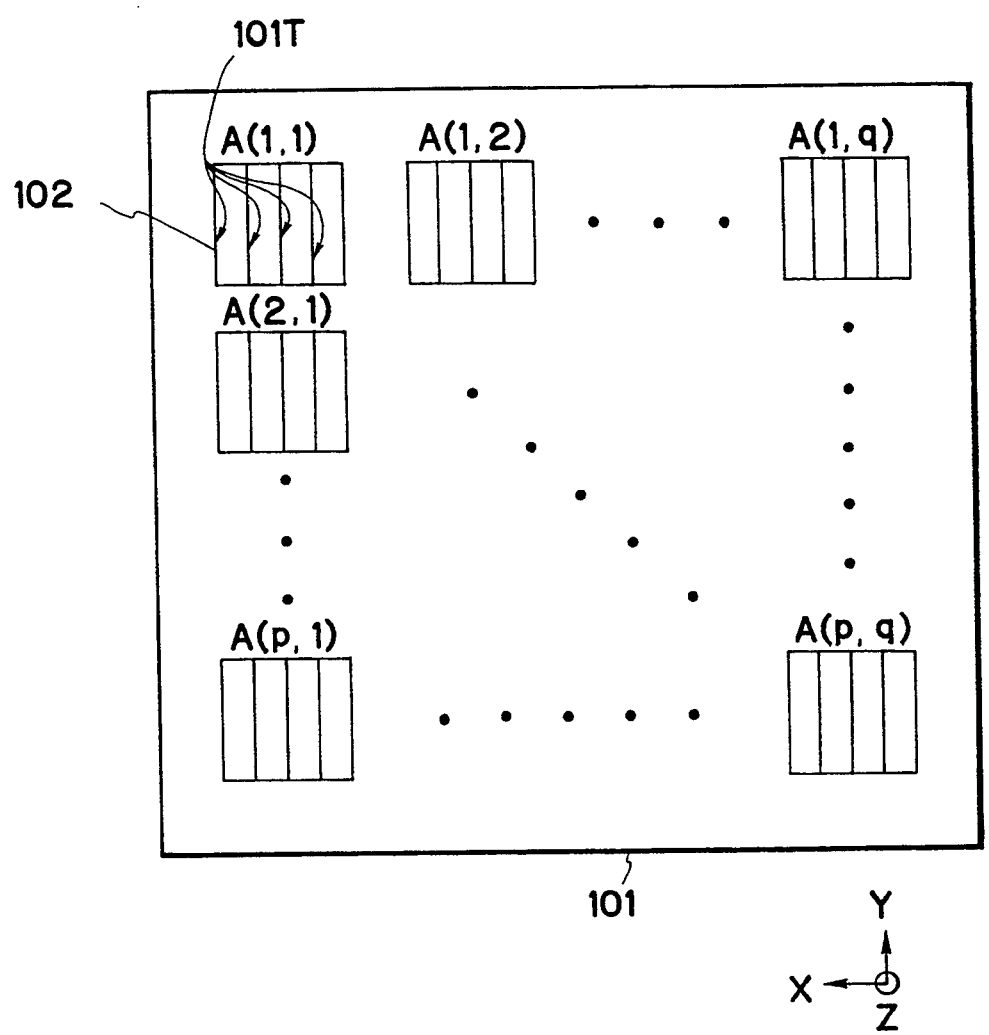
FIG. 4 is a view showing recording areas of the probe electrodes on the recording medium.
Figure 5:
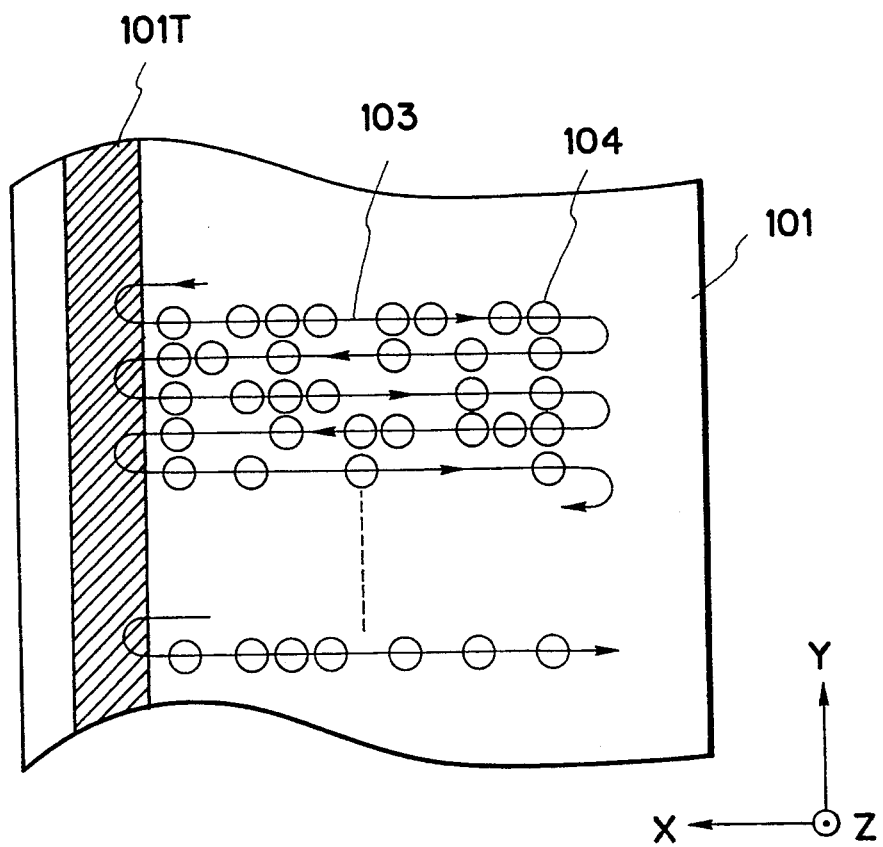
FIG. 5 is an enlarged view showing a content of the recording area.
Figure 6:
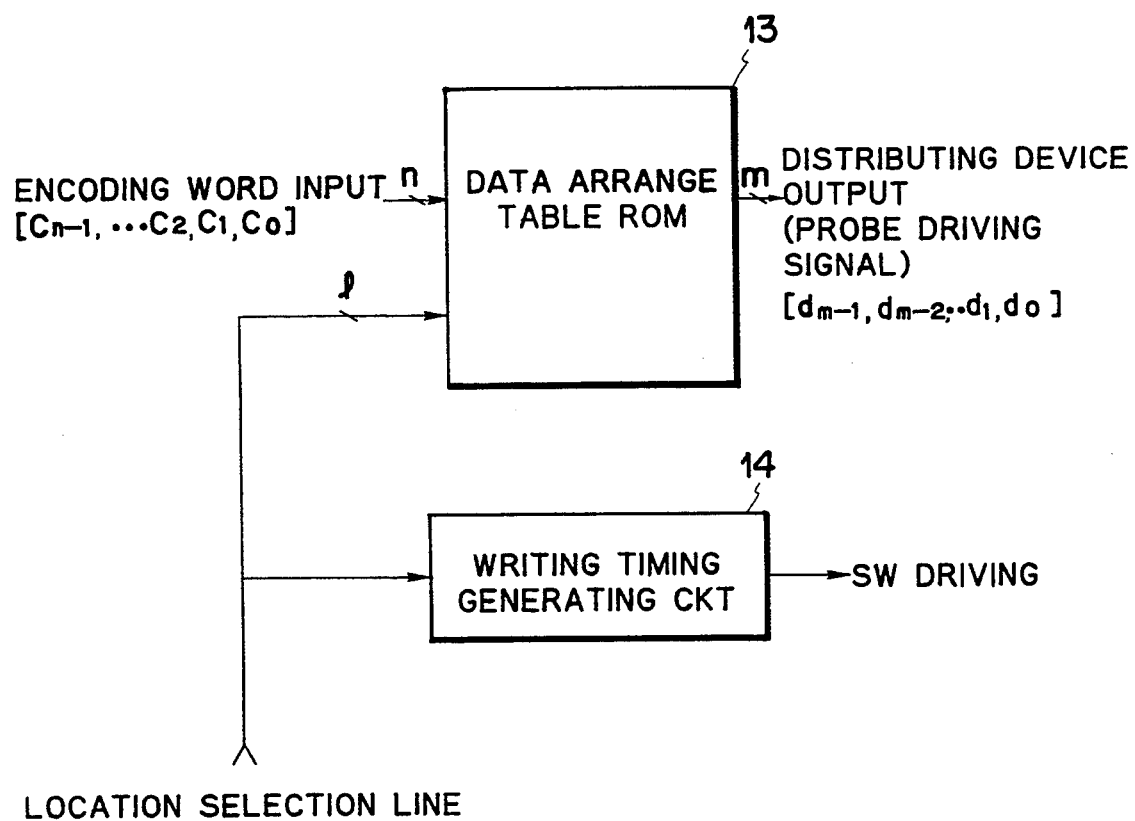
FIG. 6 is a block diagram showing details of a distributing device in the apparatus shown in FIG. 2.

FIG. 3 is a diagram showing details of a mechanism for controlling the relative position between probe electrodes and the recording medium in the recording/reproduction apparatus of this embodiment. FIG. 4 shows recording areas of the probe electrodes on the recording medium when recording is performed using the multi-probe head in which the probe electrodes are arranged in a p×q (=m) two-dimensional matrix. FIG. 5 is an enlarged view showing a state wherein recording is performed along a tracking pattern. The mechanism shown in FIG. 3 includes a scan driving circuit 31 in the X-Y direction, a piezo actuator 32 for driving the stage in the X direction, a piezo actuator 33 for driving the stage in the Y direction, a piezo actuator 34 for driving the multi-probe head 4 in the X direction, a control circuit 35 for performing data input/output operations in units of probe electrodes, and driving control in the Z direction, and a positional deviation detecting unit 36. The positional deviation detecting unit 36 detects a position signal of a tracking pattern from a tunnel current from the control circuit 35 to detect a tracking deviation, and drives the actuator 34 to correct the tracking deviation.

The interval between the probe electrodes and the recording medium is controlled to be constant. This control is performed as follows. That is, tunnel currents flowing between the probe electrodes and the recording medium are detected, and their average value is calculated. The cantilevers 5 of the probe electrodes are driven in the Z direction, so that the average value is equal to a reference value. Note that this control is made in both the recording and reproduction modes. The relative position between the multi-probe head and the recording medium is controlled by the scan driving circuit 31, such that the probe electrodes two-dimensionally scan the corresponding areas on the medium along the tracking pattern.

FIG. 4 shows the recording areas of the probe electrodes on the recording medium 7. FIG. 4 illustrates a recording medium 101, tracking patterns 101T, and a recording area A(1,1) 102 by a probe electrode (1,1). The probe electrodes arranged on the p×q matrix respectively form m=p×q recording areas. Since the stage is simultaneously scanned for the probe electrodes in the X-Y direction, the recording areas A(1,1), ..., A(p,q) are parallelly accessed. More specifically, m-bit parallel recording can be respectively performed on the m recording areas through the m probe electrodes. Furthermore, the recording areas can be subjected to recording/reproduction using a common address corresponding to the scan position in the X-Y direction. FIG. 5 shows an example of a scan operation of a probe electrode near the tracking pattern of a given recording area. In FIG. 5, the probe electrode is scanned along a path 103 to record data bits 104.

The operation of the apparatus of this embodiment in the recording and reproduction modes are as follows. In the recording mode, input data to be recorded is processed as a k-bit parallel signal. This signal is encoded to an n (n>k)-bit signal by the encoder 1. In this encoding, a conversion matrix capable of obtaining a sufficient encoding gain is selected. In this case, since a random error need only be corrected, block encoding is used. More specifically, BCH encoding is suitably employed. If an n-bit encoding word is represented by x, a generation matrix is represented by G, and k-bit recording data is represented by i, we have:

$$x = iG$$

Assume that a code length $n = 2^r - 1$, a minimum distance is represented by d, and double-error correction BCH encoding having $r = 4$ and $d = 5$ is (15,7) encoding. At this time, the generation matrix G (conversion matrix) is given by the following primitive polynomial expression:

$$G(x) = (1 + x + x^4)(1 + x + x^2 + x^3 + x^4)$$

The polynomial can be used when general digital data is recorded. Furthermore, in order to sufficiently utilize the overall burst error correction performance of the recording/reproduction system of the present invention, it is desirable to increase the data width of an encoding word to be recorded. For example, (128,112) encoding given by the following equation may be used:

$$G(x) = 1 + x + x^2 + x^7 + x^{10} + x^{11} + x^{12} + x^{13} + x^{14} + x^{15}$$

As for the encoding gain, since data bits of each encoding word are respectively recorded by independent probe electrodes, a random error caused upon addition of white Gaussian noise occurs. If the bit error rate is assumed to be $10^{-8}$, an encoding gain of 6.5 to 7.5 dB can be obtained using the above-mentioned block encoding. In this embodiment, the selection of the code length n is optimized as follows according to the number m of probe electrodes, the probe error rate, and the like. Of course, error detection and correction performance may be improved using convolution encoding.

The n-bit signal encoded by the encoder 1 is input to the distributing device 2. The distributing device 2 extracts n probe electrodes equal to the number n of bits from the m (=2,500) probe electrodes, and applies pulse voltages according to signals of bits of the n-bit signal to the extracted n probe electrodes upon selection by the switch 3, thereby writing data on the recording medium.

On the other hand, in the reproduction mode, an m-bit signal read by all the m probe electrodes 6 of the multi-probe head 4 is input to the storage device 10, and the storage device 10 selects n signal lines from m signal lines, thus generating n-bit data. The decoder 11 decodes and reproduces data by conversion reverse to the encoding performed by the encoder 1. Note that a signal is read out by detecting changes in tunnel current flowing through the probe electrodes 6 in a state wherein a constant voltage is applied between the probe electrodes 6 and the recording medium. This detection is performed by the storage device 10.

The arrangements and operations of the distributing device 2 and the storage device 10 shown in FIG. 2 will be described in more detail below. A data arrange table ROM 13 stores data tables for receiving an n-bit encoding word, and determining which of the m (=2,500) probe electrodes are to be subjected to write access. At this time, a table to be used is determined by a location selection line applied from the control CPU 12. A writing timing generating circuit 14 generates a writing timing, and performs driving and timing control operations of a write SW of the probe electrodes.

FIG. 7 shows a data content stored in the data arrange table ROM 13.

In FIG. 7, $[c_{n-1}, c_{n-2}, \ldots, c_2, c_1, c_0]$ is an input encoding word. "0" in the table indicates that no data is written at the corresponding probe electrode. $c_x$ indicates that data $c_x$ is written at the corresponding probe electrode ($d_n$).

The location selection line is a code string, which is sequentially circulated in a predetermined order. With this operation, a series of encoding word strings are distributed and located to the m probe electrodes. At this time, the content of the data arrange table ROM 13 can be selected to provide the maximum encoding gain and the minimum burst error length in accordance with the encoding method, the bit width n of an encoding word, and the number m of probe electrodes. In the case of FIG. 7, only n bits of the m probe electrodes are recorded for each location code. Another location code is assigned to non-recording probe electrodes without wasting the corresponding recording areas. More specifically, recording operations using different location codes can be performed at the same X-Y scan address, and m probe electrodes can be simultaneously subjected to a recording operation by exclusively using these location codes.

When n is selected to satisfy a relation m=n.N (N=1, 2, 3, ... ), N n-bit encoding words can be parallelly recorded. Efficient recording/reproduction can be performed, e.g., when the interleave method is used in combination with encoding.

In this embodiment, n is determined in consideration of the following condition. The probe error rate upon manufacture is represented by D, and the probe error rate generated in use is represented by E. At this time, the bit width n of an encoding word is selected to fall within a range of $m \geq n \geq m.(D+E)$. As n is larger, the burst error correction performance of the entire system is higher. However, when n becomes large, since an encoding/decoding hardware arrangement becomes large in scale, if n=a.m.(D+E), a is selected to be a =2 to 30. The encoding gain is selected to be larger as n assumes a larger value with respect to the input data bit width k. However, the recording capacity of the recording/reproduction system is then decreased by (n−k)/n. Thus, in consideration of the overall efficiency, encoding is selected to satisfy an encoding rate k/n<1−1/a according to the above-mentioned value a. In this embodiment, the BCH encoding is used. When the Viterbi algorithm (convolution encoding/Viterbi decoding) is used, a still higher encoding gain can be obtained.

The storage device 10 performs an operation reverse to that of the distributing device 2. The location selection line is applied with the same code as in the recording mode, and data read out from the probe electrodes is decoded. If readout data is decoded on the basis of a wrong location selection code, it cannot be decoded to a correct code. Thus, a location error can be easily detected. Furthermore, when a redundancy code such as a parity or a correction data bit is added, error detection can be more reliably performed.

In this embodiment, the data arrange table ROM is used as the distributing device 2 and the storage device 10. However, the present invention is not limited to a table look-up method. For example, various other methods, such as arithmetic processing based on a random logic, diffusion processing using various functional devices, and the like, may be used.

When the operation for distributing and locating encoding word bits to the probe electrodes is performed, even when some of probe electrodes are damaged, a burst error as large as 400 Mbits can be prevented. Not only an accident caused by defective probe electrodes in use of the recording/reproduction apparatus, but also a partial defect of the probe electrodes generated in the multi-probe head manufacturing process can be coped with. Even for a large partial defect on the recording medium, a burst error can be similarly avoided. These errors can always be converted to random errors or very short errors, and error correction can be easily performed using a conventional error recovery means. This embodiment has the following error recovery means.

Data is decoded by calculating a syndrome S using a check matrix H corresponding to the generation matrix G in encoding. If n-bit write data is represented by x, and readout data is represented by y, $Hx^T=0$, and a syndrome is calculated by $S=Hy^T$. More specifically, if S=0, no error is determined. However, if S≠0, an error vector e satisfying $S=He^T$ is obtained, and the readout data is corrected by x=y−e.

In this embodiment, the above-mentioned arithmetic operation is performed using, e.g., a signal processor. The same processing can be realized when a polynomial arithmetic circuit is used as a cyclic code. The present invention may employ various other encoding/decoding methods. For example, cross-interleave double-encoding Reed-Solomon encoding mainly used in the audio field, spread encoding added with a check bit mainly used in a data communication, and the like may be used.

A series of data location cyclic codes may be used as a password when data is decoded. When the location codes are respectively assigned to users who use the recording/reproduction apparatus, secrecy among users can be assured. Furthermore, since data is distributed to the wide area of the recording medium, it is almost impossible for a third party to decode data from the recording medium, resulting in high secrecy.

According to the present invention, in a recording/reproduction apparatus using a multi-probe head, a data error can be eliminated, and data omission caused by repetitive use can be prevented, thus improving reliability. Even when the multi-probe head has some defective probe electrodes, since data can be recorded/reproduced, the manufacturing yield of the multi-probe head can be increased. Thus, a low-cost apparatus with high productivity can be provided.

What is claimed is:

1. An information recording apparatus for recording information on a recording medium using probe electrodes, said apparatus comprising:
   a recording medium;
   a plurality of probe electrodes opposing said recording medium;
   means for encoding information to be recorded;

means for distributing the encoded information to said plurality of probe electrodes; and means for driving said plurality of probe electrodes on the basis of the distributed information so as to record the information on said recording medium.

2. An apparatus according to claim 1, wherein said encoding means changes the information to be recorded to information including an error correction code.

3. An information recording/reproduction apparatus for recording and reproducing information on and from a recording medium using probe electrodes, said apparatus comprising:

a recording medium;

a plurality of probe electrodes opposing said recording medium;

means for encoding information to be recorded;

means for distributing the encoded information to said plurality of probe electrodes;

means for driving said plurality of probe electrodes on the basis of the distributed information so as to record the information on said recording medium;

means for reading out information from said recording medium using said plurality of probe electrodes;

means for storing the information read out from said recording medium using said plurality of probe electrodes; and means for decoding the stored information to reproduce the recorded information.

4. An apparatus according to claim 3, wherein said encoding means changes the information to be recorded to information including an error correction code.

5. An apparatus according to claim 3, wherein the information is read out from said recording medium using changes in tunnel current flowing through said probe electrodes.

6. An information recording method for recording information on a recording medium using a plurality of probe electrodes, said method comprising the steps of:

encoding information to be recorded;

distributing the encoded information to the plurality of probe electrodes; and driving the plurality of probe electrodes on the basis of the distributed information so as to record the information on the recording medium.

7. A method according to claim 6, wherein said encoding step changes the information to be recorded to information including an error correction code.

8. An information recording/reproducing method for recording and reproducing information on and from a recording medium using a plurality of probe electrodes, said method comprising the steps of:

encoding information to be recorded;

distributing the encoded information to the plurality of probe electrodes;

driving the plurality of probe electrodes on the basis of the distributed information so as to record the information on the recording medium;

reading out information from the recording medium using the plurality of probe electrodes;

storing the information read out from the recording medium using the plurality of probe electrodes; and decoding the stored information to reproduce the recorded information.

9. A method according to claim 8, wherein said encoding step changes the information to be recorded to information including an error correction code.

10. A method according to claim 8, wherein the information is read out from said recording medium using changes in tunnel current flowing through said probe electrodes.

11. An information recording apparatus for recording information on a recording medium using probe electrodes, said apparatus comprising:

a plurality of probe electrodes opposing said recording medium;

means for encoding information to be recorded;

means for distributing the encoded information to said plurality of probe electrodes; and means for driving said plurality of probe electrodes on the basis of the distributed information so as to record the information on said recording medium.

12. An apparatus according to claim 11, wherein said encoding means changes the information to be recorded to information including an error correction code.

13. An information recording/reproducing apparatus for recording and reproducing information on and from a recording medium using probe electrodes, said apparatus comprising:

a plurality of probe electrodes opposing the recording medium;

means for encoding information to be recorded;

means for distributing the encoded information to said plurality of probe electrodes;

means for driving said plurality of probe electrodes on the basis of the distributed information so as to record the information on the recording medium;

means for reading out information from the recording medium using said plurality of probe electrodes;

means for storing the information read out from the recording medium using said plurality of probe electrodes; and means for decoding the stored information to reproduce the recorded information.

14. An apparatus according to claim 13, wherein said encoding means changes the information to be recorded to information including an error correction code.

* * * * *

UNITED STATES PATENT AND TRADEMARK OFFICE
CERTIFICATE OF CORRECTION

PATENT NO. : 5,394,388
DATED : February 28, 1995
INVENTOR(S) : KATSUNORI HATANAKA, ET AL.

It is certified that error appears in the above-identified patent and that said Letters Patent is hereby corrected as shown below:

ON TITLE PAGE

In [56] References Cited, under FOREIGN PATENT DOCUMENTS:
"01196751    8/1989    Japan ." should read
-- 1-196751   8/1989    Japan .--.

COLUMN 6

Line 32, "G(x)=" should read --G(x)-- and "$x^{14}+x^{-15}$" should read --$x^{14}+x^{15}$--.

Signed and Sealed this

Sixteenth Day of May, 1995

Attest:

BRUCE LEHMAN

*Attesting Officer*     *Commissioner of Patents and Trademarks*